(12) United States Patent
Kang et al.

(10) Patent No.: US 10,431,543 B2
(45) Date of Patent: Oct. 1, 2019

(54) DIFFERENTIAL INDUCTOR AND SEMICONDUCTOR DEVICE INCLUDING THE SAME

(71) Applicant: ELECTRONICS AND TELECOMMUNICATIONS RESEARCH INSTITUTE, Daejeon (KR)

(72) Inventors: Dongwoo Kang, Daejeon (KR); Bon Tae Koo, Daejeon (KR)

(73) Assignee: ELECTRONICS AND TELECOMMUNICATIONS RESEARCH INSTITUTE, Daejeon (KR)

(*) Notice: Subject to any disclaimer, the term of this patent is extended or adjusted under 35 U.S.C. 154(b) by 0 days.

(21) Appl. No.: 15/895,549

(22) Filed: Feb. 13, 2018

(65) Prior Publication Data
US 2018/0277480 A1    Sep. 27, 2018

(30) Foreign Application Priority Data
Mar. 22, 2017 (KR) .................. 10-2017-0036320

(51) Int. Cl.
| | | |
|---|---|---|
| H01L 23/522 | (2006.01) |
| H01F 27/29 | (2006.01) |
| H01L 23/66 | (2006.01) |
| H01L 49/02 | (2006.01) |
| H01F 17/00 | (2006.01) |
| H01F 17/02 | (2006.01) |

(52) U.S. Cl.
CPC ..... H01L 23/5227 (2013.01); H01F 17/0013 (2013.01); H01F 17/02 (2013.01);
(Continued)

(58) Field of Classification Search
CPC ..... H01L 23/5227; H01L 23/66; H01L 28/10; H01L 2223/6661; H01L 21/30655;
(Continued)

(56) References Cited

U.S. PATENT DOCUMENTS 6,992,366 B2   1/2006 Kim et al.
9,218,903 B2   12/2015 Sun et al.
(Continued)

FOREIGN PATENT DOCUMENTS

KR   10-2004-0042130 A   5/2004
KR      10-0834744 B1    6/2008

*Primary Examiner* — Shahed Ahmed
(74) *Attorney, Agent, or Firm* — Rabin & Berdo, P.C.

(57) ABSTRACT

Provided are a differential inductor and a semiconductor device including the same, the differential inductor including first circular parts and second circular parts disposed on a first layer and composing a first spiral shape, a first semi-circular part disposed on the first layer and in the first circular part that is an innermost one of the first circular parts, and a second semi-circular part disposed outside the first circular part that is an outermost one of the first circular parts, third semi-circular parts and fourth semi-circular parts disposed on a second layer under the first layer and composing a second spiral shape, connection means configured to connect, to one, the first and second circular parts, and the first to fourth semi-circular parts, wherein the second circular parts are respectively interposed between the first circular parts, and a part of the fourth semi-circular parts is respectively interposed between the second semi-circular parts.

14 Claims, 15 Drawing Sheets

(52) U.S. Cl.
CPC ............. *H01F 27/29* (2013.01); *H01L 23/66* (2013.01); *H01L 28/10* (2013.01); *H01F 2017/002* (2013.01); *H01L 2223/6661* (2013.01)

(58) Field of Classification Search
CPC ......... H01L 27/0288; H01L 2924/1206; H01L 2924/19042; H01F 27/29; H01F 27/2804; H01F 27/2823; H01F 41/06; H01F 27/00–427
See application file for complete search history.

(56) References Cited

U.S. PATENT DOCUMENTS

| | | | | |
|---|---|---|---|---|
| 2003/0222750 | A1* | 12/2003 | Kyriazidou | H01F 17/0013 336/200 |
| 2004/0017278 | A1* | 1/2004 | Castaneda | H01F 17/0006 336/200 |
| 2005/0190035 | A1* | 9/2005 | Wang | H01F 17/0013 336/200 |
| 2008/0150670 | A1 | 6/2008 | Chung et al. | |
| 2010/0259351 | A1* | 10/2010 | Bogert | H01F 5/003 336/200 |
| 2010/0295648 | A1* | 11/2010 | Huang | H01F 17/0006 336/200 |
| 2011/0133877 | A1* | 6/2011 | Chiu | H01F 17/0013 336/200 |
| 2011/0133878 | A1 | 6/2011 | Chiu et al. | |
| 2013/0249660 | A1* | 9/2013 | Ler | H01F 17/0013 336/200 |
| 2014/0225702 | A1* | 8/2014 | Yazaki | H01F 17/0013 336/200 |
| 2015/0091687 | A1* | 4/2015 | Valentin | H01F 17/0013 336/200 |
| 2015/0130579 | A1* | 5/2015 | Kim | H01F 27/2804 336/200 |
| 2017/0213637 | A1* | 7/2017 | Vanukuru | H01F 17/0013 |

* cited by examiner

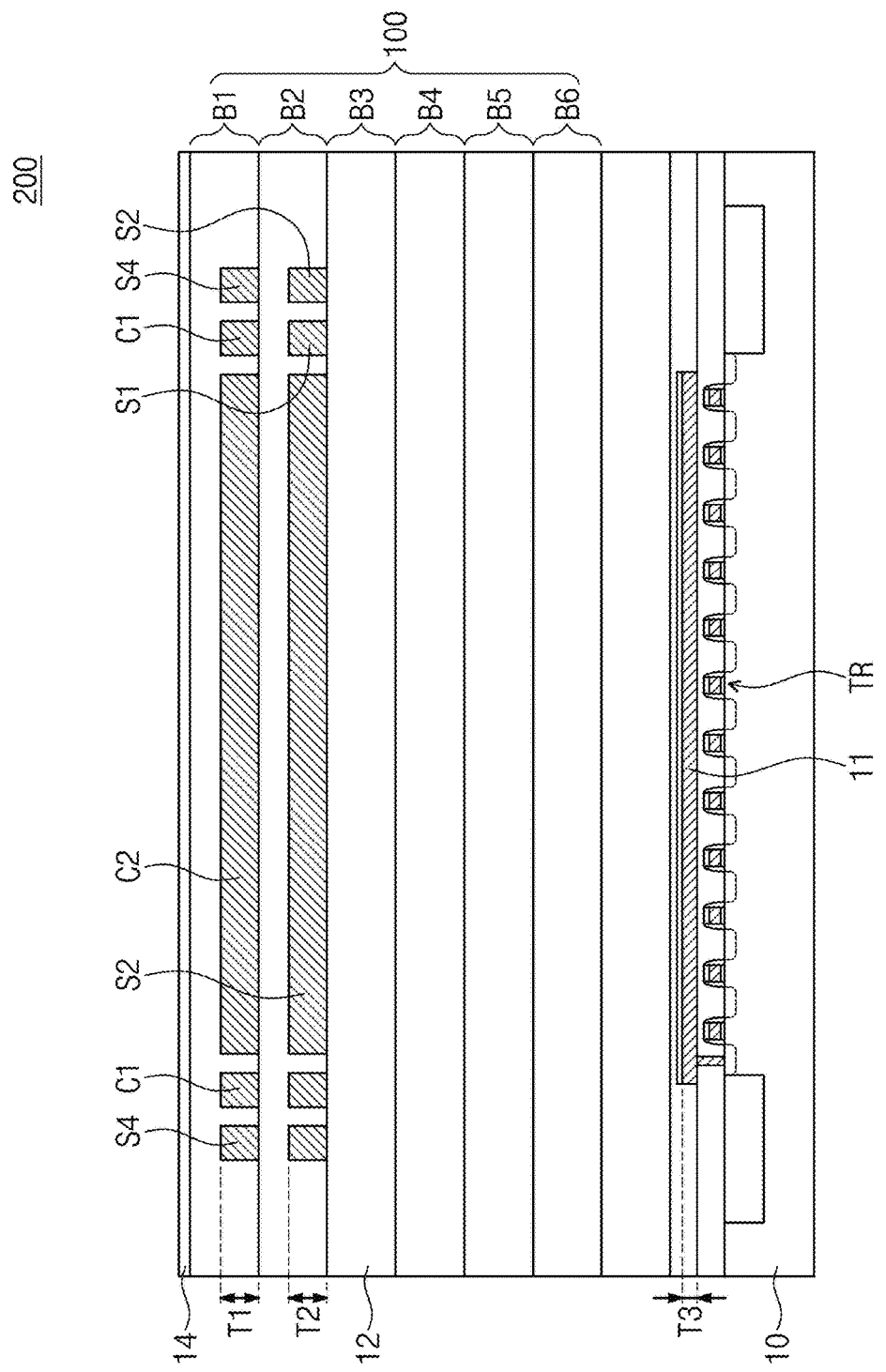

DIFFERENTIAL INDUCTOR AND SEMICONDUCTOR DEVICE INCLUDING THE SAME

CROSS-REFERENCE TO RELATED APPLICATIONS

This U.S. non-provisional patent application claims priority under 35 U.S.C. § 119 of Korean Patent Application No. 10-2017-0036320, filed on Mar. 22, 2017, the entire contents of which are hereby incorporated by reference.

BACKGROUND

The present disclosure relates to a differential inductor and a semiconductor device including the same, and more particularly, to a multilayered symmetric differential inductor and a semiconductor device including the same.

Among unit circuit elements of an RF device, an inductor is considered to be a unit circuit element occupying the largest area and influencing an important performance. It is most difficult to miniaturize an inductor among the unit circuit elements, and thus, the inductor becomes an obstacle to improve a degree of integration of a semiconductor device that includes an analog operation or inductor. It is not so difficult to miniaturize other unit circuit elements (transistor, resistor, and capacitor, etc.), because the size thereof becomes naturally smaller as the degree of integration of a semiconductor is higher. However, for an inductor, it is difficult to miniaturize the same only by reducing the size such as a line width or line length. For example, in order to obtain higher inductance from a certain area, a method for increasing the number of turns of an inductor may be considered at first. However, in order to obtain an inductor having a higher L, it is necessary to secure a proper wire width and a proper distance between wires, and to be designed in consideration of patterns of other layers. Therefore it is very difficult to implement a high quality inductor.

SUMMARY

The present disclosure provides a differential inductor capable of providing higher inductance and a quality factor in a certain plane.

The present disclosure also provides a highly integrated semiconductor device.

An embodiment of the inventive concept provides a differential inductor including: first circular parts and second circular parts disposed on a first layer and composing a first spiral shape; a first semi-circular part disposed on the first layer and in the first circular part that is an innermost one of the first circular parts, and a second semi-circular part disposed outside the first circular part that is an outermost one of the first circular parts; third semi-circular parts and fourth semi-circular parts disposed on a second layer under the first layer and composing a second spiral shape; connection means configured to connect, to one, the first and second circular parts, and the first to fourth semi-circular parts, wherein the second circular parts are respectively interposed between the first circular parts, and a part of the fourth semi-circular parts is respectively interposed between the second semi-circular parts.

In an embodiment, the differential inductor may further include: a first terminal line disposed on the first layer and connected to the first circular part that is disposed an outermost one among the first circular parts; and a second terminal line disposed on the first layer and connected to the second semi-circular part.

In an embodiment, the connection means may include vias, straight bars and oblique bars.

In an embodiment, the oblique bars may include first oblique bars configured to connect the third semi-circular parts, and a third terminal line is further included which is electrically connected to one of the first oblique bars and disposed on the first layer.

In an embodiment, the third terminal line may be interposed between the first terminal line and the second terminal line, and the first to third terminal lines may be parallel to each other.

In an embodiment, current flow directions inside the first circular parts and second circular parts may be identical.

In an embodiment of the inventive concept, a semiconductor device includes: a first wire on a semiconductor substrate; and a differential inductor disposed on the first wire to be separated from the first wire, wherein the differential inductor includes: first circular parts and second circular parts disposed on a first layer and composing a first spiral shape; a first semi-circular part disposed on the first circular layer and in the first circular part that is an innermost one of the first circular parts, and a second semi-circular part disposed outside the first circular part that is an outermost one of the first circular parts; third semi-circular parts and fourth semi-circular parts disposed on a second layer under the first layer and composing a second spiral shape; connection means configured to connect, to one, the first and second circular parts, and the first to fourth semi-circular parts, wherein the second circular parts are respectively interposed between the first circular parts, and a part of the fourth semi-circular parts is respectively interposed between the second semi-circular parts.

In an embodiment, the first and second circular parts may be thicker than the first wire.

In an embodiment, the first to fourth semi-circular parts may be thicker than the first wire.

In an embodiment, the semiconductor device may further include: interlayer insulation films configured to respectively cover the first wire, the circular parts and the semi-circular parts; and a passivation film configured to cover an uppermost interlayer insulation film among the interlayer insulation films, wherein the first layer corresponds to the uppermost interlayer insulation film.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIG. 4 illustrates one sectional view of the semiconductor device including the differential inductor of FIG. 1;

DETAILED DESCRIPTION

Figure 1:
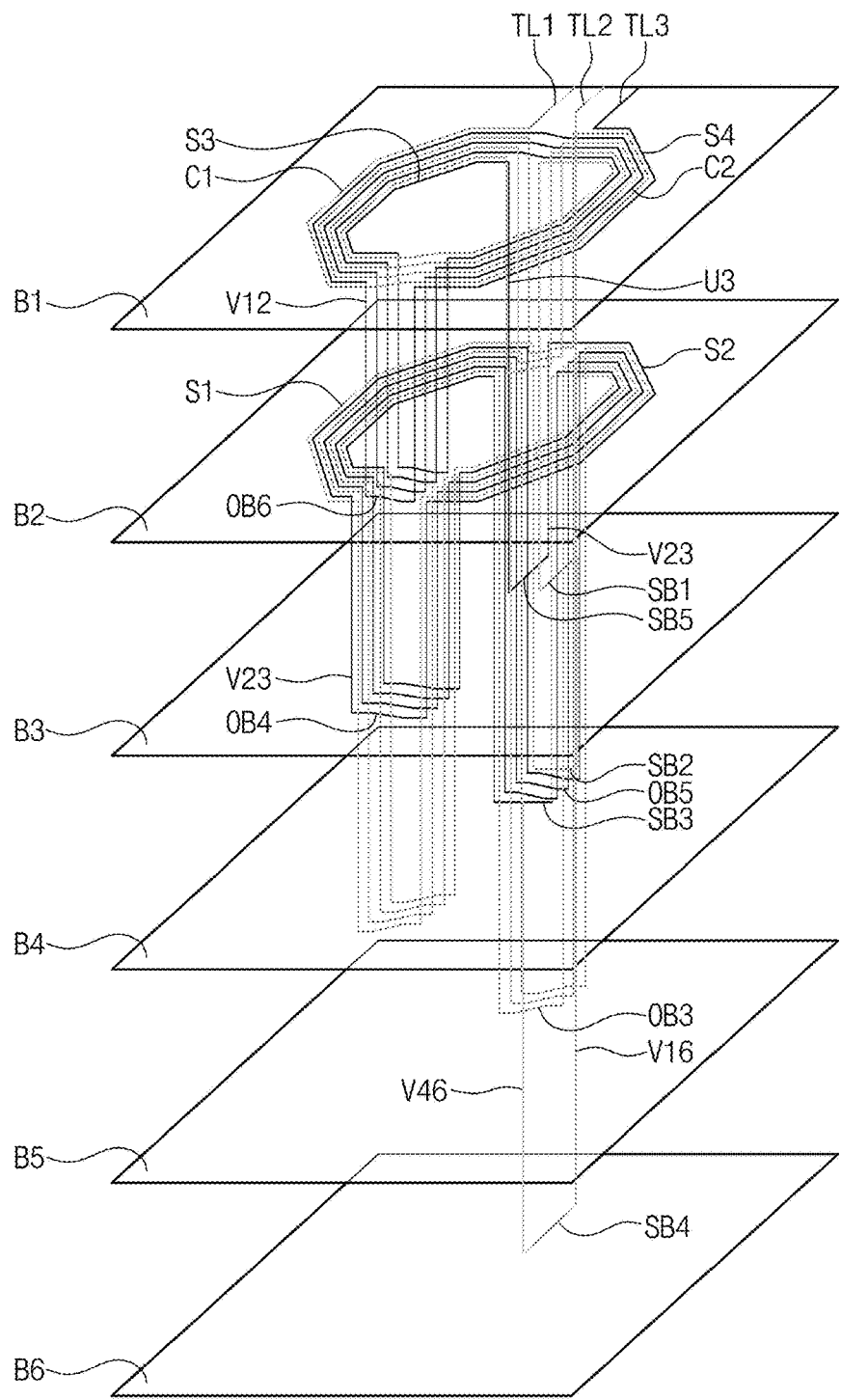
FIG. 1 is a perspective view of a differential inductor according to an inductor of the inventive concept.
Figure 2A:
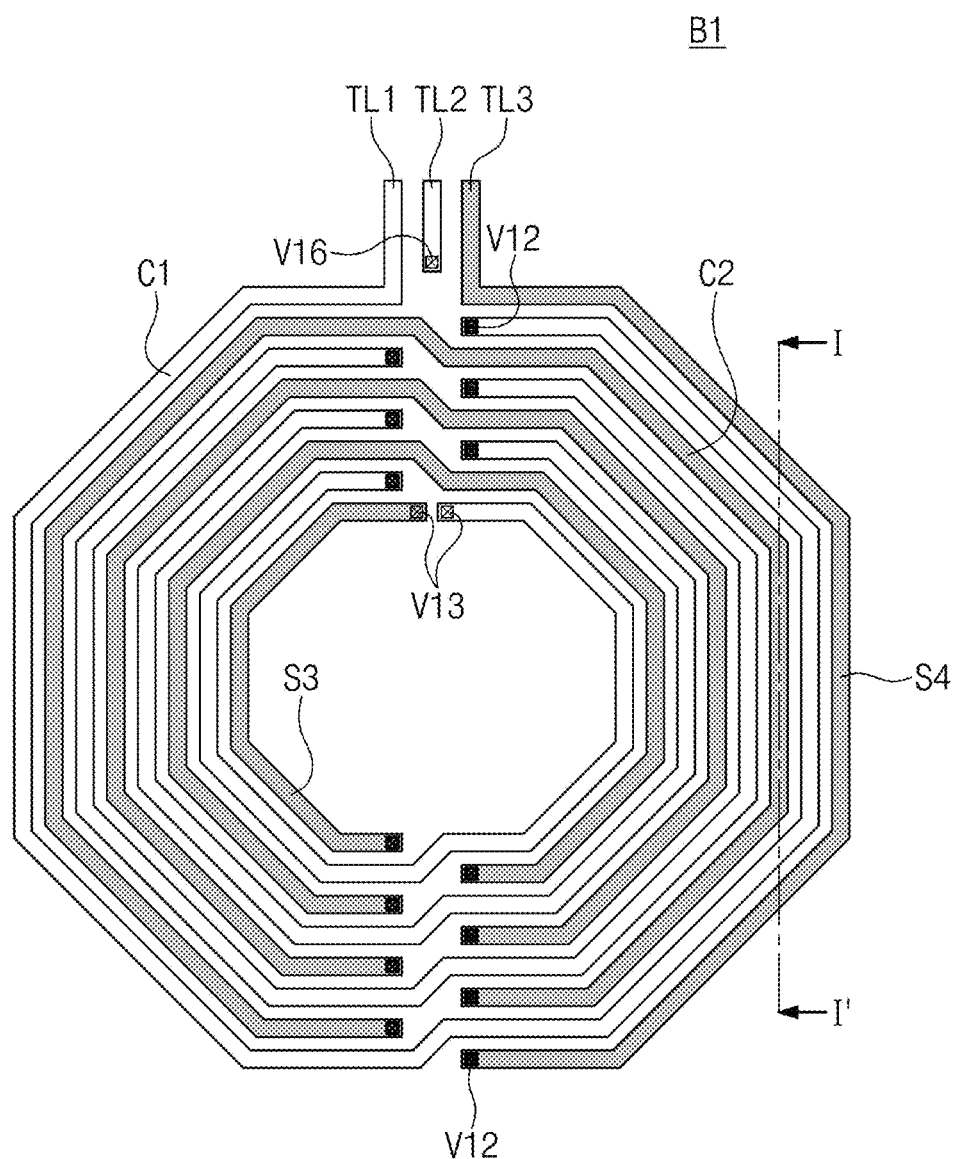
FIGS. 2A to 2F show plane shapes of elements of an inductor disposed in each layer in FIG. 1.
Figure 2B:
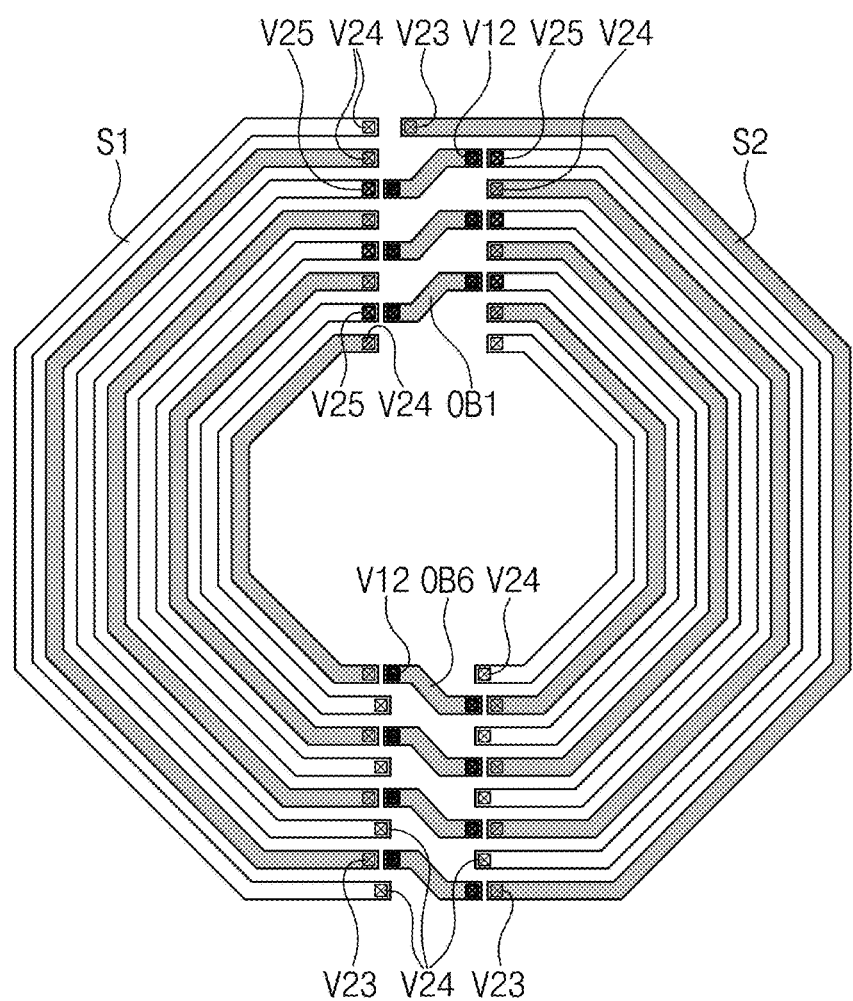
Figure 2C:
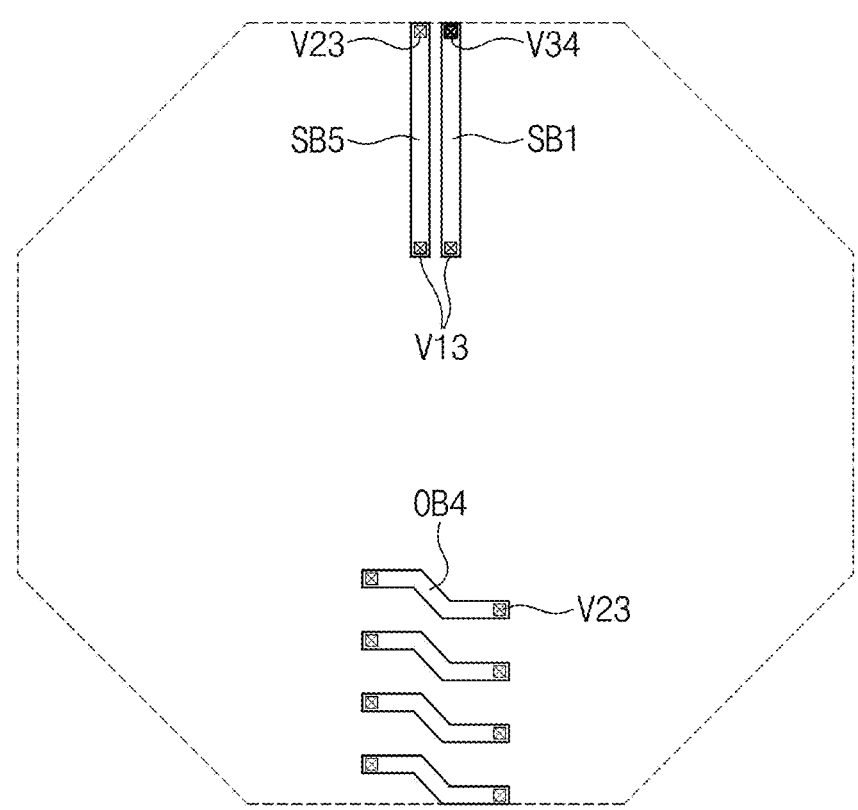
Figure 2D:
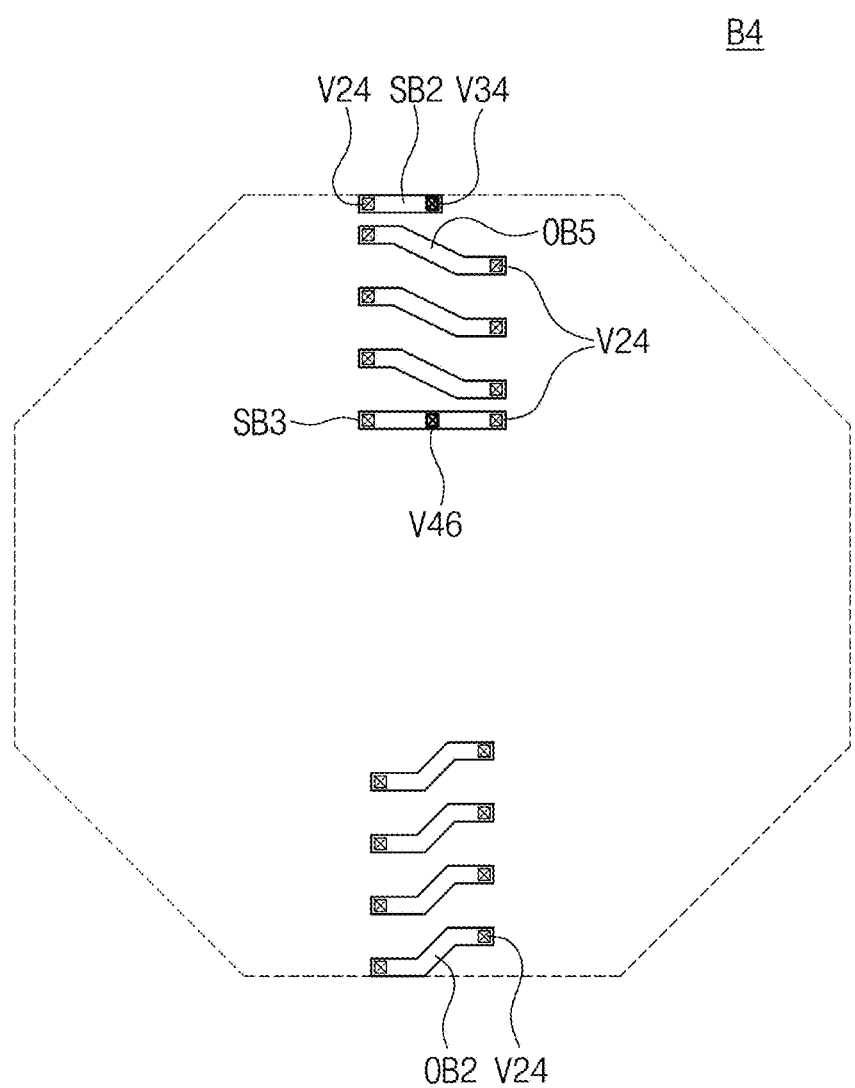
Figure 2E:
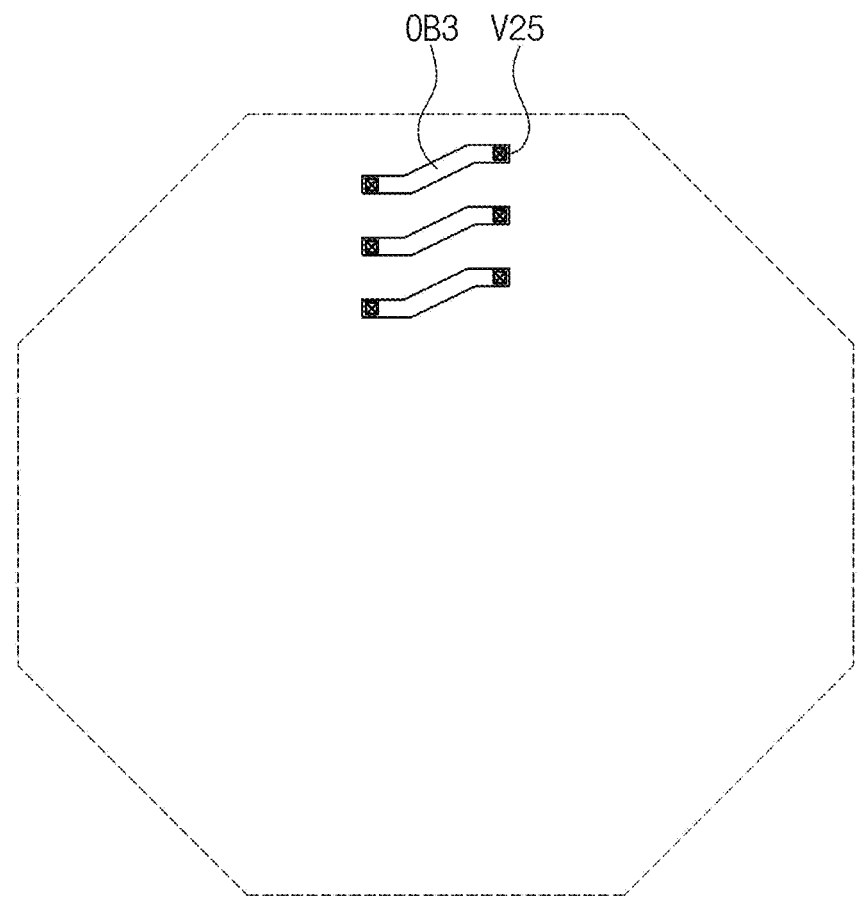
Figure 2F:
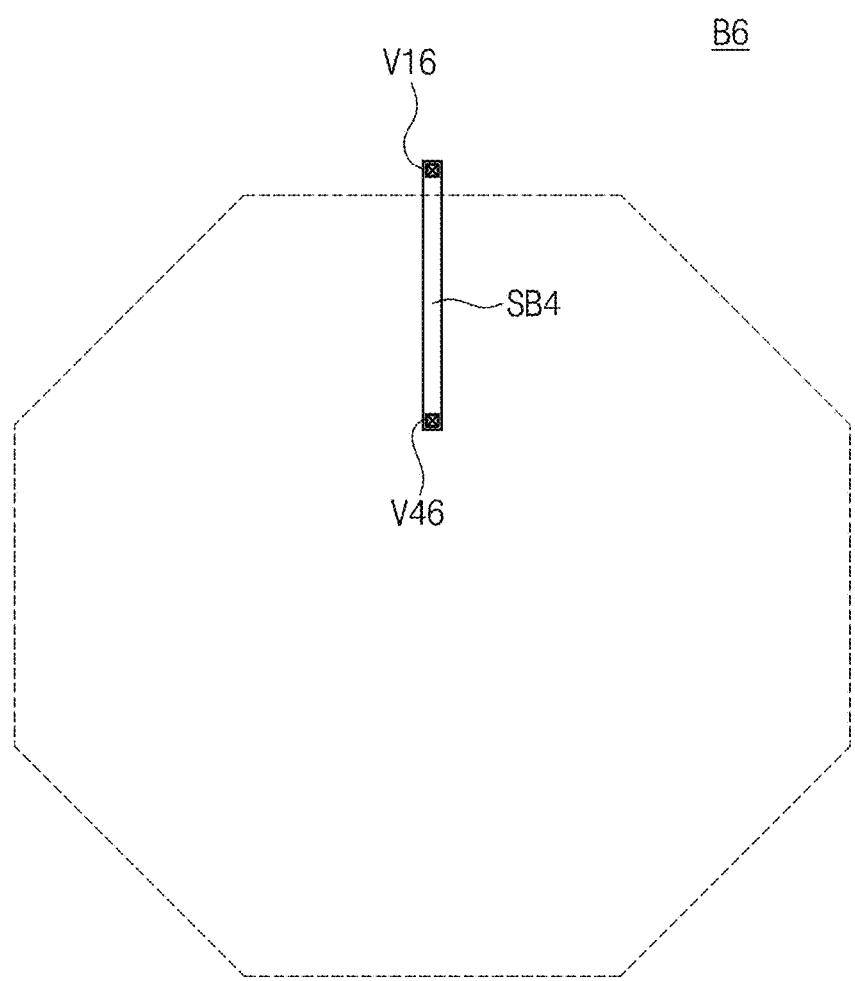
Figure 3A:
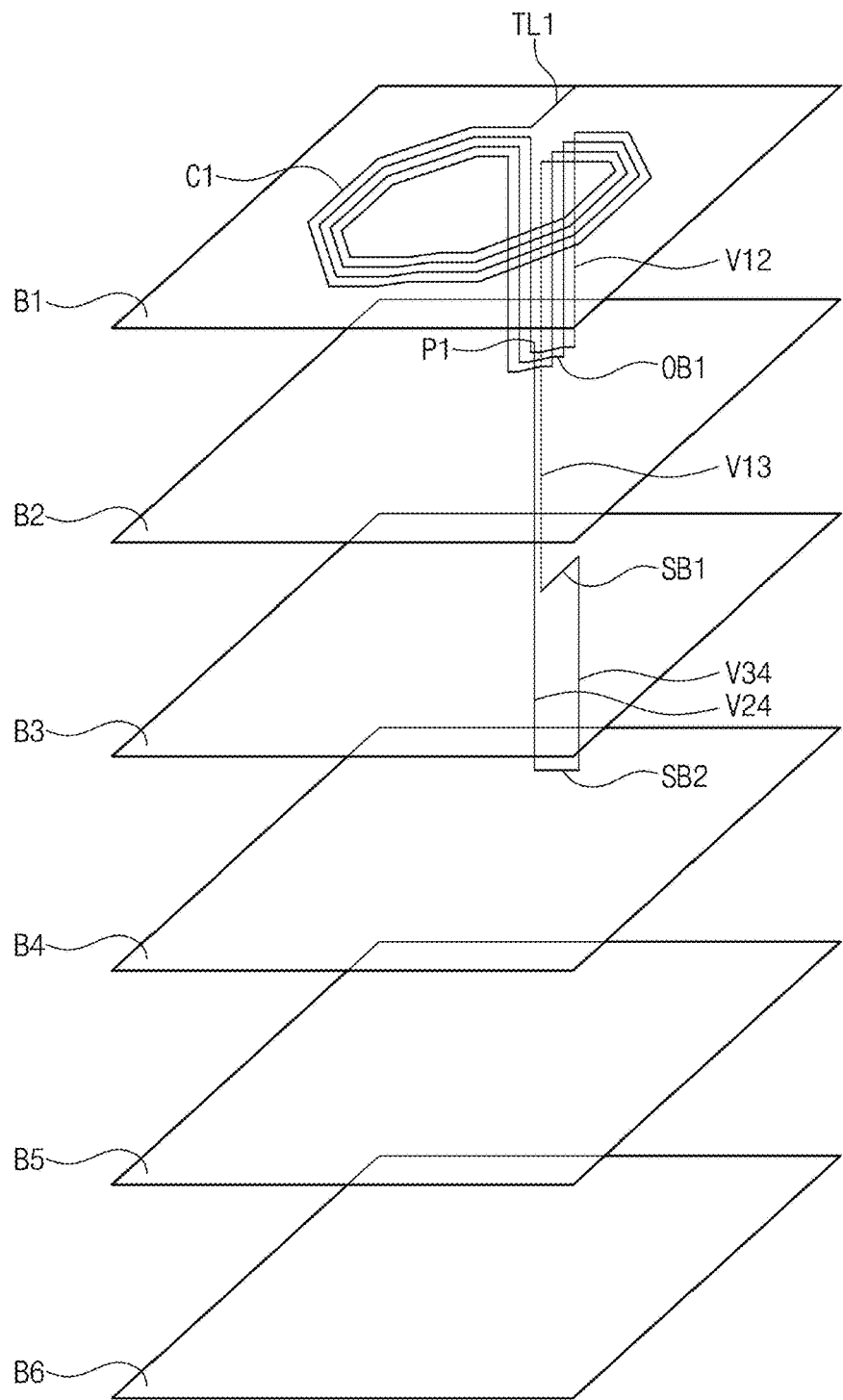
FIGS. 3A to 3E are perspective views sequentially showing connection relationships between the elements of the differential inductor of FIG. 1.
Figure 3B:
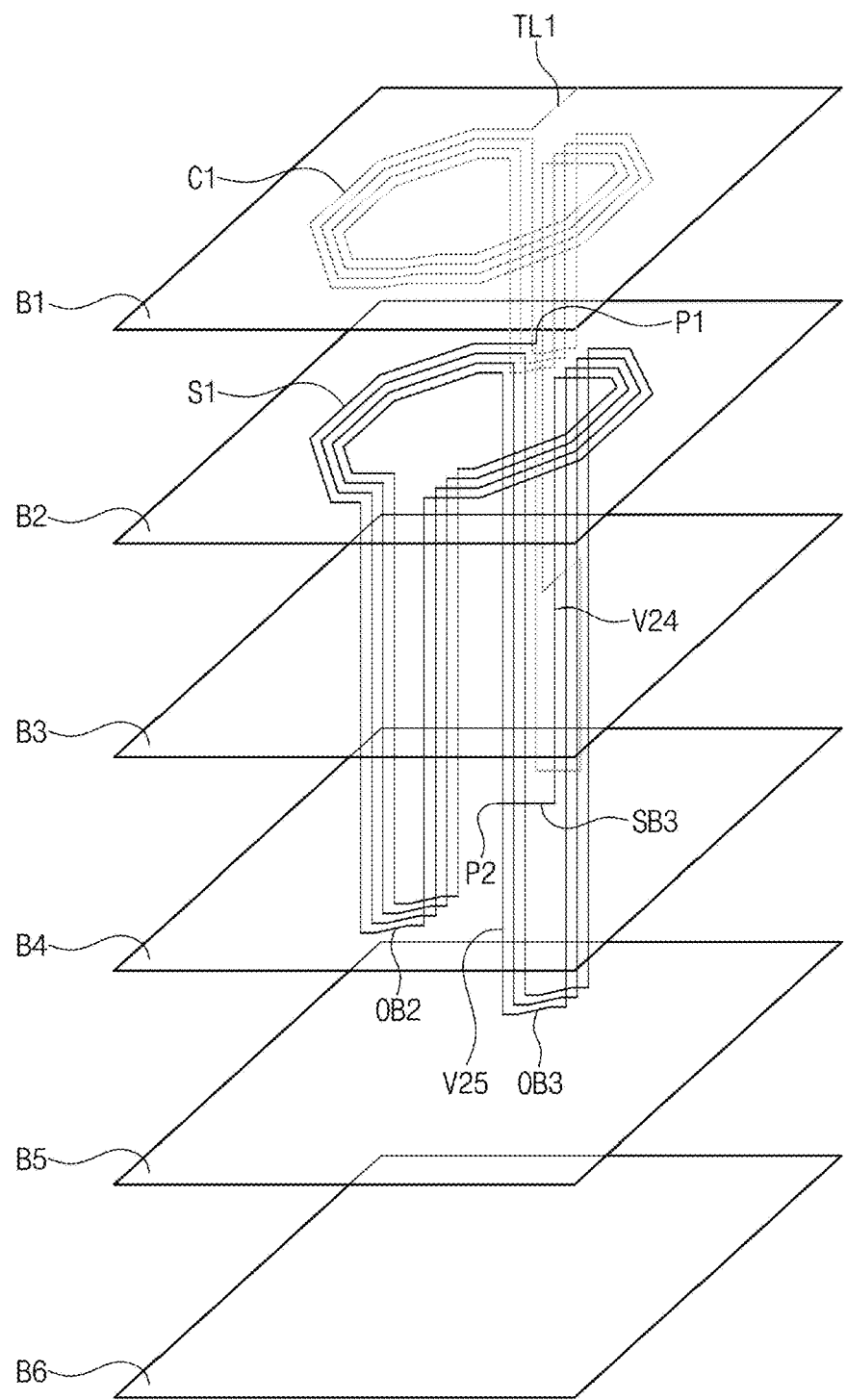
Figure 3C:
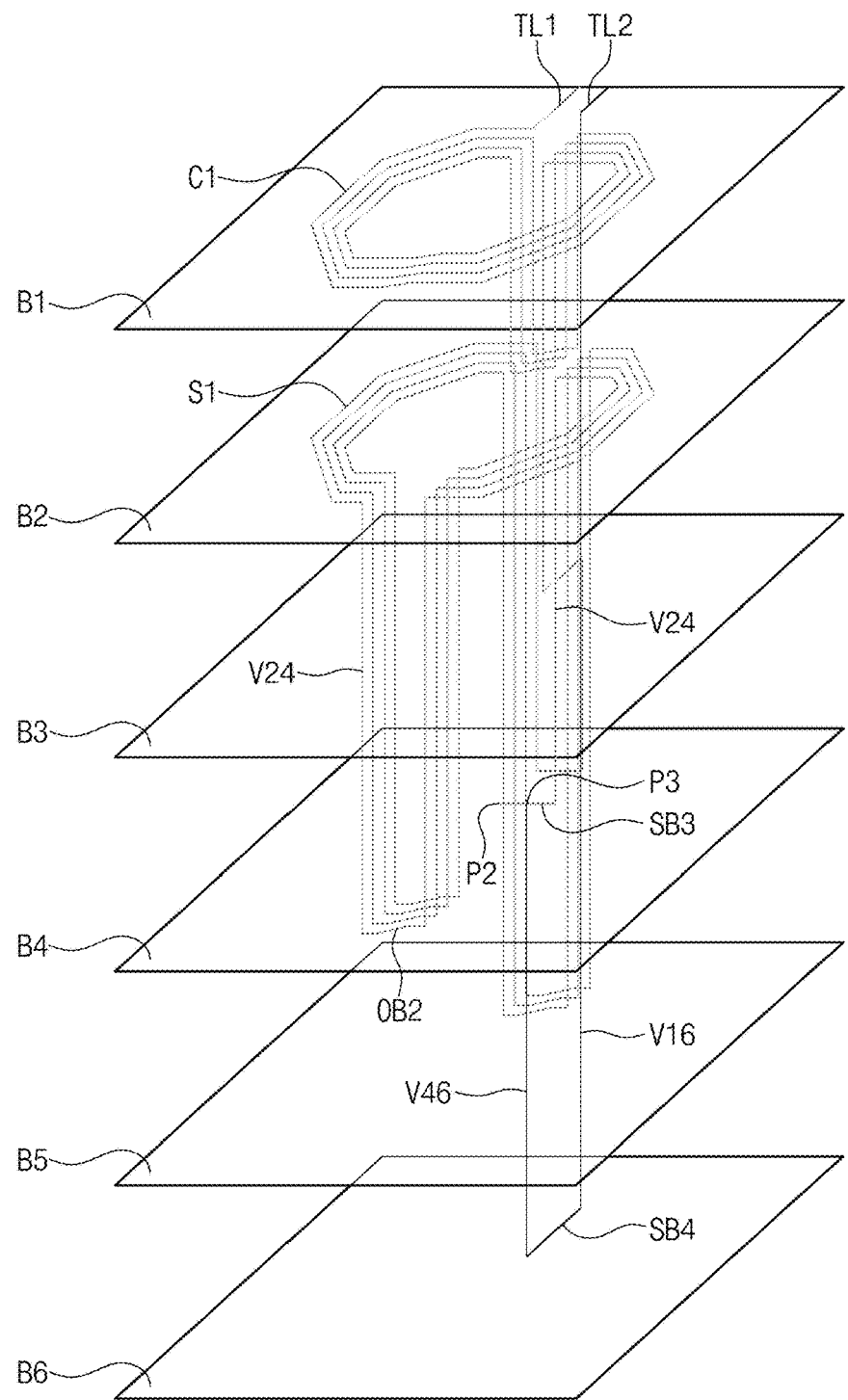
Figure 3D:
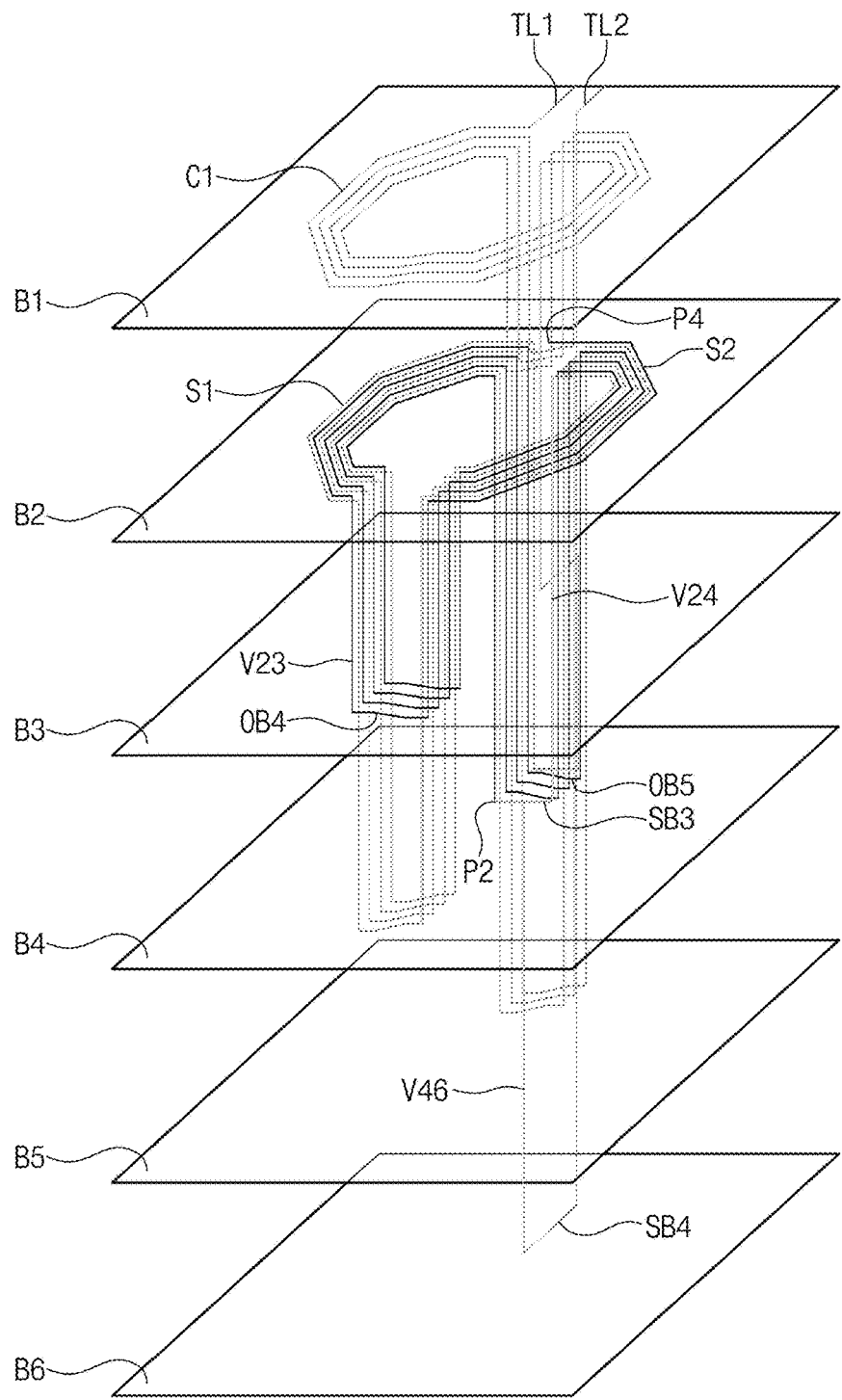
Figure 3E:
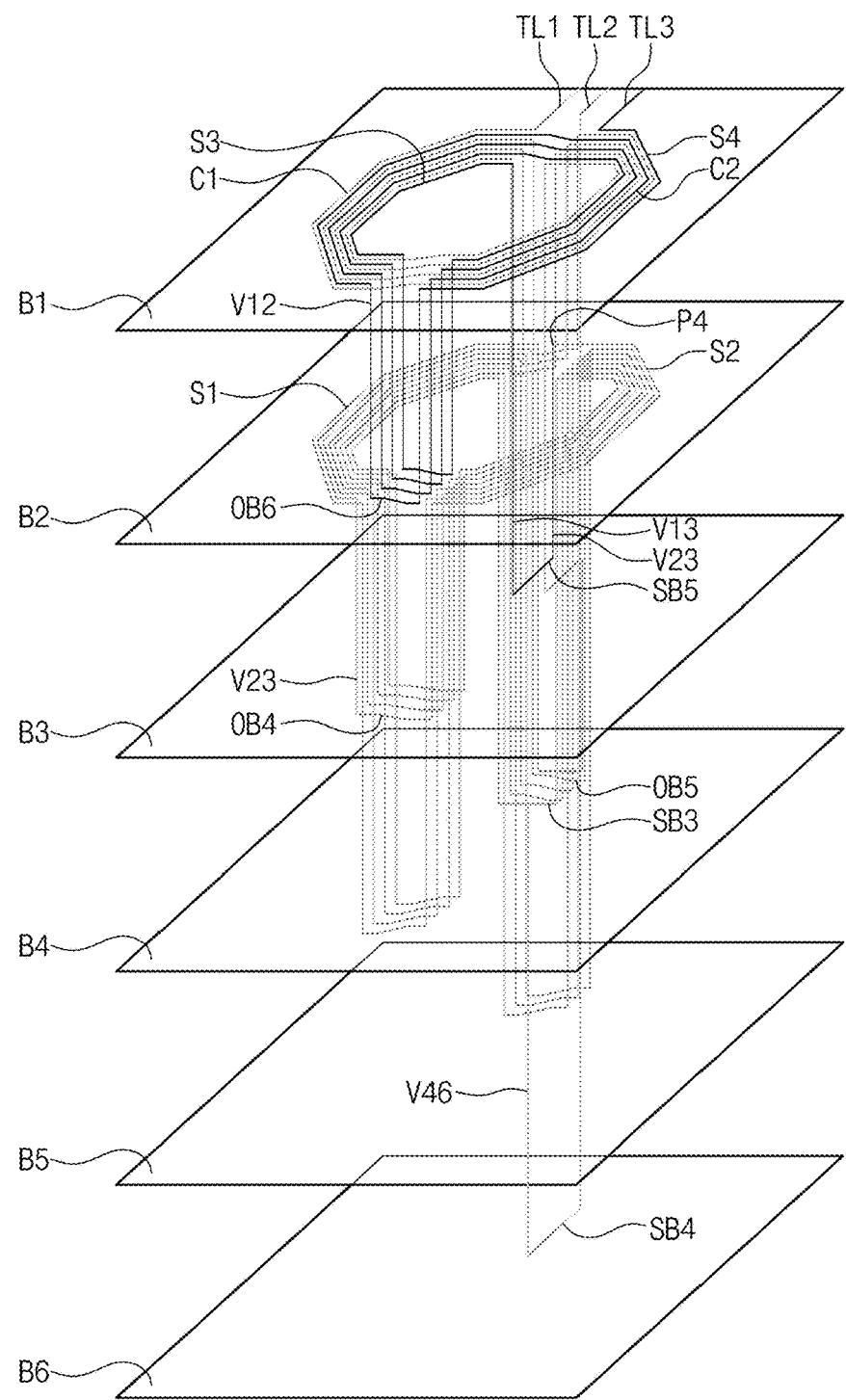

The above objects, other objects, features and advantages will be easily understood through preferred embodiments with reference to accompanying drawings. The invention may, however, be embodied in many different forms and should not be construed as being limited to the embodiments set forth herein. Rather, these embodiments are provided so that this disclosure will be thorough and complete, and will fully convey the concept of the invention to those skilled in the art.

In the specification, it will be understood that when an element is referred to as being "on" another element, it can be directly on or intervening a third element may be present. In the drawings, the dimensions of layers and regions are exaggerated for clarity of illustration.

Moreover, exemplary embodiments are described herein with reference to cross-sectional views and/or plane views that are idealized exemplary illustrations. In the drawings, the dimensions of layers and regions are exaggerated for clarity of illustration. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching area shown with a right angle may be formed in a round form or in a form having a prescribed curvature. Thus, the regions illustrated in the figures are schematic in nature and their shapes are not intended to illustrate the actual shape of a region of a device and are not intended to limit the scope of example embodiments. In exemplary embodiments of this specification, terms such as "first" and "second" are used for describing various constituent elements, but the constituent elements are not limited by the terms. The terms are used only for distinguishing a constituent element from other constituent elements. Exemplary embodiments described and illustrated here include complementary exemplary embodiments thereof.

The terminology used herein is for the purpose of describing particular embodiments only and is not intended to limit the scope of the present disclosure. As used herein, the singular forms "a", "an" and "the" are intended to include the plural forms as well, unless the context clearly indicates otherwise. A meaning of "comprises" and/or "comprising" used in a specification does not exclude the presence or addition of at least one of other constituent elements.

Hereinafter, exemplary embodiments of the inventive concept will be described in detail with reference to the accompanying drawings.

FIG. 1 is a perspective view of a differential inductor according to an inductor of the inventive concept. FIGS. 2A to 2F show plane shapes of elements of an inductor disposed in each layer in FIG. 1.

Referring to FIG. 1 and FIGS. 2A to 2F, a differential inductor 100 according to the present example is disposed across a multilayer. For example, the differential inductor 100 may be disposed across from a first layer B1 down to a sixth layer B6. The differential inductor 100 includes first to third terminal lines TL1, TL2, and TL3, first and second circular parts C1 and C2, first to fourth semi-circular parts S1, S2, S3, and S4, connection vias V12, V13, V16, V23, V25, V34, and V46, first to fifth straight bars SB1 to Sb5, and first to sixth oblique bars OB1 to OB6.

On the first layer B1, the first to third terminal lines TL1, TL2, and TL3, the first and second circular parts C1 and C2, the third and fourth semi-circular parts S3 and S4 are disposed. The first to third terminal lines TL1, Tl2, and TL3 may be adjacent and parallel to each other. The second circular parts C2 may be respectively interposed between the first circular parts C1. The first and second circular parts C1 and C2 may entirely compose a spiral shape. The third semi-circular parts S3 may be disposed in the first circular part C1 that is the innermost one out of the first circular parts C1. The fourth semi-circular parts S4 may be disposed outside the first circular part C1 that is the outermost one out of the first circular parts C1. The first and second circular parts C1 and C2 and the third and fourth semi-circular parts S3 and S4 may be implemented in a similar type to that of 8 different-sized overlapping octagons that are cut on the first layer B1. The first and second circular parts C1 and C2 and the third and fourth semi-circular parts S3 and S4 may entirely compose a spiral shape.

The first and second semi-circular parts S1 and S2 and the first and sixth oblique bars OB1 and OB6 are disposed on the second layer B2 below the first layer B1 and may entirely compose a spiral shape. A part of the second circular parts S2 may be respectively interposed between the first semi-circular parts S1. On the contrary, a part of the first circular parts S1 may be respectively interposed between the second semi-circular parts S2. The first oblique bars OB1 may have a symmetric shape to the sixth oblique bars OB6. A part of the first semi-circular part S1 may be disposed in the left side and the rest may be disposed in the right side. A part of the second semi-circular part S2 may be disposed in the left side and the rest may be disposed in the right side. The first and second semi-circular parts S1 and S2 may be implemented in a similar shape to that of 8 different-sized overlapping octagons that are cut on the first layer B1.

The first and fifth straight bars SB1 and SB5 and the fourth oblique bars OB4 are disposed on the third layer B3 below the second layer B2. The first and fifth straight bars SB1 and SB5 may be adjacent and parallel to each other. The fourth oblique bars OB4 may have an identical shape and be disposed adjacent to each other.

The second and third straight bars B2 and B3, and the second and fifth oblique bars OB2 and OB5 are disposed on the fourth layer B4 below the third layer B3. The fifth oblique bars OB5 may be interposed between the second and third straight bars SB2 and SB3. The second straight bar SB2 may be shorter than and parallel to the third straight bar SB3.

The third oblique bars OB3 are disposed on the fifth layer B5 below the fourth layer B4. The fourth oblique bar SB4 is disposed on the sixth layer B6 below the fifth layer B5.

The connection relationships of the differential inductor will be described in relation to FIGS. 3A to 3E. FIGS. 3A to 3E are perspective views sequentially showing connection relationships of the elements of the differential inductor of FIG. 1.

Referring to FIGS. 1, 2A to 2F, and 3A, the first terminal line TL1 on the first layer B1 is connected to the first semi-circular part C1 that is the outermost one out of the first semi-circular parts C1. An end of the first circular part C1 is connected to the first oblique bar OB1 through a first to second layer connection via V12. The first oblique bar OB1 is connected again to the other first circular part C1 through a first to second layer connection via V12. The first circular parts C1 may be connected to each other through the first oblique bars OB1 and the first to second layer connection via V12 and compose a planar spiral shape. An end of the first circular part C1 that is the innermost one out of the first circular parts C1 is connected to the first straight bar SB1 disposed on the third layer B3 through a first to third layer connection via V13. The first straight bar SB1 is connected again to the second straight bar SB2 disposed on the fourth layer B4 through a third to fourth layer connection via V34. The other end of the second straight bar SB2 is connected to a second to fourth layer connection via V24.

Referring to FIGS. 1, 2A to 2F, and 3B, the second to fourth layer connection via V24 is connected at a first point P1 to the first semi-circular part S1 that is the left outermost one out of the first semi-circular part S1 on the second layer B2. The other end of the first semi-circular part S1 is connected to the second oblique bar OB2 disposed on the fourth layer through the second to fourth layer connection via V24. The other end of the second oblique bar OB2 is connected to the first semi-circular part S1 that is the right outermost one out of the first semi-circular parts S1 through the second to fourth layer connection via V24. The other end of the first semi-circular part S1 is connected to the third oblique bar OB3 disposed on the fifth layer through a second to fifth layer connection via V25. The other end of the third oblique bar OB3 is connected to the left other first semi-circular part S1 through the second to fifth layer connection via V25. The first semi-circular parts S1 may be connected to each other through the second to fourth layer connection vias V24, the second oblique bars OB2, the second to fifth layer connection vias V25, and the third oblique bars OB3, and compose a planar spiral shape. An end of the first semi-circular part S1 that is the innermost one out of the first semi-circular parts S1 is connected to the third straight bar SB3 disposed on the fourth layer B4 through the second to fourth layer connection via V24.

Referring to FIGS. 1, 2A to 2F, and 3C, the second to fourth layer connection via V24 may be connected at an intermediate point P3 of the third straight line SB3 to the fourth straight bar SB4 disposed on the sixth layer B6 through a fourth-to-sixth layer connection via V46. The other end of the fourth straight bar SB4 may be connected to the second terminal line TL2 disposed on the first layer B1 through a first to sixth layer connection via V16.

Referring to FIGS. 1, 2A to 2F, and 3D, the other end of the third straight bar SB3 disposed on the fourth layer B4 is connected to the second semi-circular part S2 that is the left innermost one out of the second semi-circular parts S2 through the second to fourth layer connection via V24. The other end of the second semi-circular part S2 is connected to the fourth oblique bar OB4 through a second to third layer connection via V23. The other end of the fourth oblique bar OB4 is connected to the left other second semi-circular part S2. The other end of the second semi-circular part S2 is connected to the fifth oblique bar OB5 through the second to fourth layer connection via V24. The second semi-circular parts S2 may be connected to each other through the second-to third layer connection vias V23, the fourth oblique bars OB4, the second to fourth layer connection vias V24, and the fifth oblique bars OB5, and compose a planar spiral shape. A spiral composed of the second semi-circular parts S2 passes a spiral composed of the first semi-circular parts S1 and then have a narrower space therebetween, and thus may provide a higher density integrated structure and allow the number of turns to be increased to improve inductance.

Referring to FIGS. 1, 2A to 2F, and 3E, an end of the second semi-circular part S2 that is the right outermost one out of the second semi-circular parts S2 is connected at a fourth point P4 on the second layer B2 to the fifth straight bar SB5 on the third layer B3 through the second to third layer connection via V23. The other end of the fifth straight bar SB5 may be connected to the third semi-circular part S3 that is the innermost one out of the third semi-circular parts S3 on the first layer B1 through the first to third layer connection via V13. The other end of the third semi-circular part S3 is connected to the sixth oblique bar OB6 on the second layer through the first to second layer connection via V12. The other end of the sixth oblique bar OB6 is connected to the second circular part C2 through the first to second layer connection via V12. The second circular part C2 that is the outermost one out of the second circular parts C2 is connected to the fourth semi-circular part S4 through the first to second layer connection via V12 and the sixth oblique bar OB6. The fourth semi-circular part S4 is connected to the third terminal line TL3. A spiral composed of the second circular parts C2 passes a spiral composed of the first circular parts C1 and then have a narrower space therebetween, and thus may provide a higher density integrated structure and allow the number of turns to be increased to improve inductance.

The differential inductor 100 according to the inventive concept has a similar shape to 8 different-sized overlapping octagons on each of the first layer B1 and the second layer B2, and thus has the number of turns as many as 8 on each layer, which results in higher inductance. In addition, the differential inductor 100 has a symmetric form between the first layer B1 and the second layer B2, and thus is suitably applied to a differential structure circuit.

One of the first terminal line TL1 and the third terminal line TL3 may be an input line and the other may be an output line. Alternatively, one of the first terminal line TL1 and the third terminal line TL3 may be connected to an anode and the other may be connected to a cathode. The second terminal line TL2 may be a ground line and connected to the ground, or receive a power supply voltage VDD. Since a spiral form composed of the first and second circular parts C1 and C2 and a spiral form composed of the first and second semi-circular parts S1 and S2 are almost identical and turn directions thereof are same, directions of currents flowing therethrough are also identical.

The differential inductor 100 according to the present example has a spiral structure disposed across two layers, and thus about double inductance may be obtained therethrough with respect to a certain area. Furthermore, since terminal lines TL1, TL2, and Tl3 are all disposed on the uppermost layer of the metal layers, it is easier to apply a voltage. The differential inductor 100 may be disposed in a semiconductor device. The first layer B1 may be disposed on the uppermost layer of metal layers in the semiconductor device.

The differential inductor 100 may be used for making most CMOS circuits insensitive to an influence of noise or ground. In particular, in a high frequency differential amplifier, the differential inductor 100 may be used for obtaining a high gain by gain-peaking. Alternatively, the differential inductor 100 may be used in a mixer or a voltage-controlled oscillator.

FIG. 4 illustrates one sectional view of the semiconductor device including the differential inductor of FIG. 1.

Referring to FIG. 4, when it is assumed that the inductor element is cut along, for example, line I-I', cross sections shown on the first layer B1 and the second layer B2 may be like FIG. 4 in the semiconductor device 200 according to the present example. In the semiconductor device 200, a plurality of transistors TR and a first wire 11 may be disposed on a semiconductor substrate 10. The first wire 11 may be, for example, a bit line. The differential inductor 100 may be disposed on the first wire 11. The differential inductor 100 may be formed from a metal such as tungsten or copper. The differential inductor 100 may be formed through a deposition process and etching process, or a dual damascene process, etc. The first layer B1 of the differential inductor 100 may be the uppermost layer in the semiconductor device. The first wire 11, transistors TR, and differential inductor 100 may be covered with interlayer insulation films 12. The interlayer insulation film 12 disposed on the uppermost layer may be covered with a passivation film 14. The first and second circular parts C1 and C2 and the third and fourth semi-circular parts S3 may have the same first thickness T1. The first and second semi-circular parts S1 and S2 have the same second thickness T2. The first wire 11 may have a third thickness T3. Since disposed on the uppermost layer and the next lower layer, spiral structures of the differential inductor 100 are not (or less not) influenced by a design constraint such as a transistor or a bit line that composes a semiconductor device, and accordingly, the first thickness T1 and the second thickness T2 may be thicker than the third thickness T3. Therefore, electrical resistance of the differential inductor 100 may be reduced and a value of quality factor (Q) may be enhanced.

Although not illustrated in FIG. 4, terminal lines TL1 to TL3 of the differential inductor 100 may be respectively adjacent to conductive pads. The conductive pads may penetrate through the passivation film 14 and the interlayer insulation film 12 thereunder to be adjacent to the terminal lines TL1 to TL3.

Figure 5:
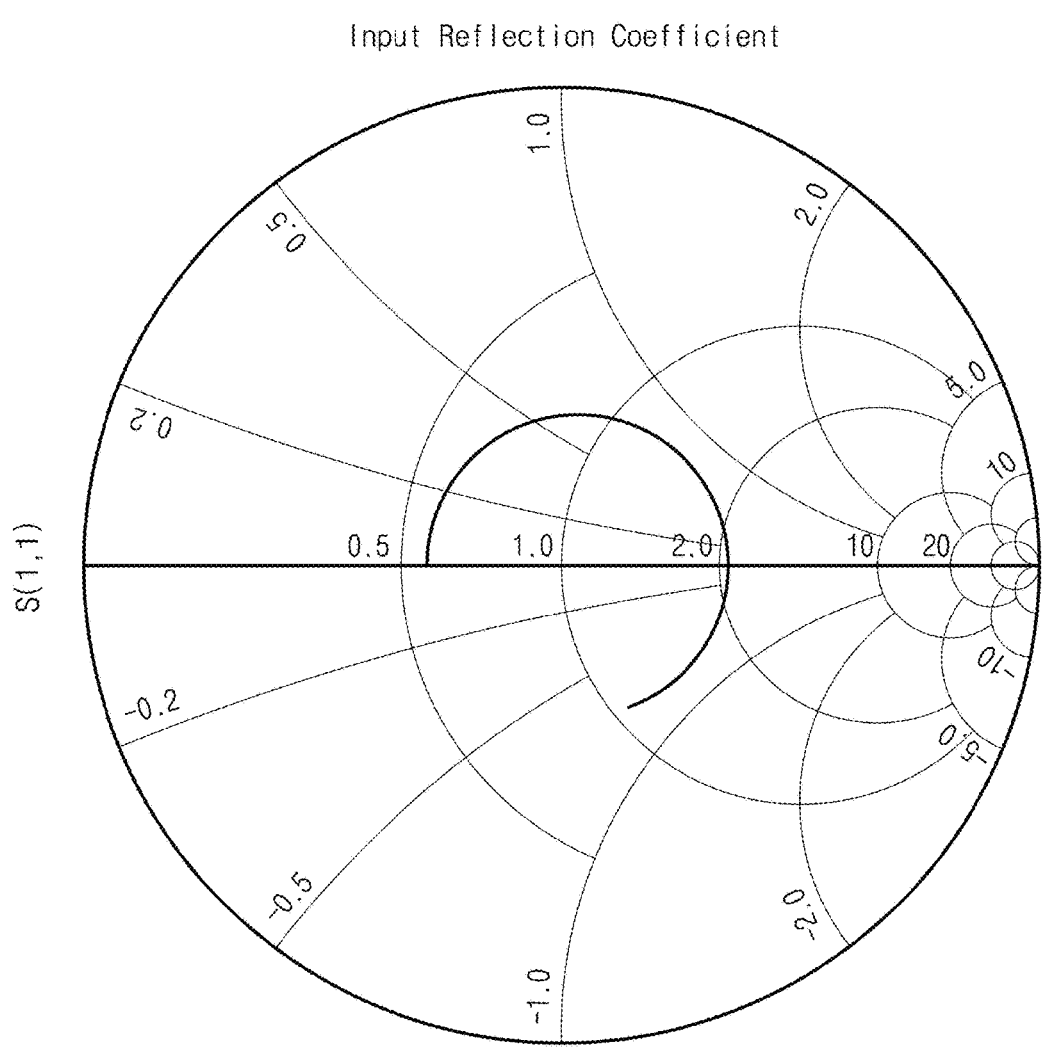
FIG. 5 is a graph showing impedance of the differential inductor of FIG. 1 in a Smith chart type.

FIG. 5 is a graph showing impedance of the differential inductor 100 of FIG. 1 in a Smith chart type. In detail, the planar size of the differential inductor 100 of FIG. 1 is formed with 170 μm width, 170 μm height, the second terminal TL2 is connected to the ground, an RF high frequency signal is applied to the first terminal line TL1, and impedance of the differential inductor 100 is measured in a state where a resistor of 50Ω is connected to the third terminal line TL3. Through FIG. 5, it may be seen that the differential inductor 100 operates as an inductor.

Figure 6:
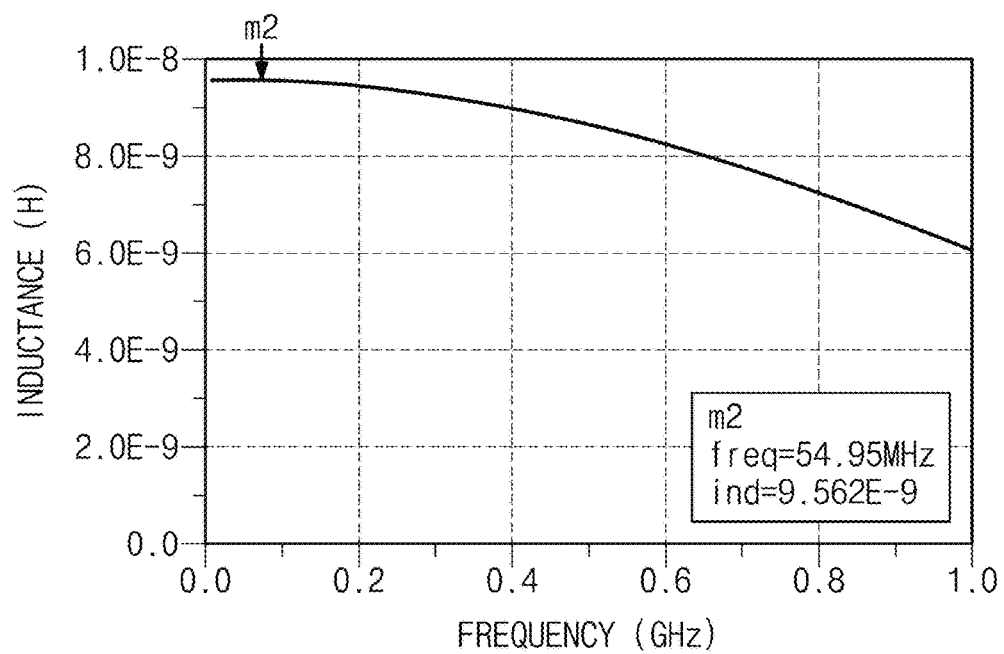
FIG. 6 is a graph showing inductance according to a frequency of an inductor of the inventive concept.

FIG. 6 is a graph showing inductance according to a frequency of an inductor of the inventive concept. Referring to FIG. 5, it may be seen that at about 54.95 MHz, the inductance is about 9.5 nH. On the basis of this value, differential inductance may be calculated to be 19 nH. For an inductor of which spiral structure exists on only one layer with the same planar size, the differential inductance becomes about 10 nH. Since a spiral structure is disposed across two layers in the differential inductor according to the inventive concept, about double inductance may be obtained with respect to the same area.

A differential inductor according to embodiments of the present disclosure may have a configuration of symmetric circular parts across two layers to obtain double the inductance with respect to a certain area. In addition, since disposed in the top layer and the next lower layer among metal layers in a semiconductor device, the differential inductor may be formed thicker than wires such as word lines or bit lines configuring a semiconductor circuit. Therefore, electrical resistance may be reduced and a value of quality factor (Q) may be enhanced. Furthermore, since terminal lines are all disposed on the uppermost layer of metal layers, it is easier to apply a voltage. Since a semiconductor device including a differential inductor may obtain higher inductance from a certain area, it is advantageous for high density integration.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A differential inductor comprising:
   first circular parts and second circular parts disposed on a first layer and composing a first spiral shape;
   first semi-circular parts and second semi-circular parts disposed on a second layer under the first layer and composing a second spiral shape;
   a third semi-circular part disposed on the first layer at least partly within an innermost first circular part of the first circular parts, and
   a fourth semi-circular part disposed outside an outermost first circular part of the first circular parts; and
   connection means configured to interconnect one of the first and second circular parts and the first to fourth semi-circular parts,
   wherein at least portions of the second circular parts are respectively interposed between the first circular parts, and
   at least portions of the second semi-circular parts are respectively interposed between the first semi-circular parts.

2. The differential inductor of claim 1, further comprising:
   a first terminal line disposed on the first layer and connected to the outermost first circular part; and
   a second terminal line disposed on the first layer and connected to the fourth semi-circular part.

3. The differential inductor of claim 2, wherein the connection means comprise vias, straight bars and oblique bars.

4. The differential inductor of claim 3, wherein:
   the oblique bars comprise at least one oblique bar configured to connect at least one of the first semi-circular parts to another of the first semi-circular parts, and
   the inductor further comprises a third terminal line electrically connected to one of the straight bars and disposed on the first layer.

5. The differential inductor of claim 4, wherein the third terminal line is interposed between the first terminal line and the second terminal line, and the first to third terminal lines are parallel to each other.

6. The differential inductor of claim 1, wherein current flow directions inside the first circular parts and the second circular parts are identical to each other.

7. A semiconductor device comprising:
   a first wire on a semiconductor substrate; and
   a differential inductor disposed on the first wire to be separated from the first wire,
   wherein the differential inductor comprises:
   first circular parts and second circular parts disposed on a first layer and composing a first spiral shape;
   first semi-circular parts and second semi-circular parts disposed on a second layer under the first layer and composing a second spiral shape;
   a third semi-circular part disposed on the first layer at least partly within an innermost first circular part of the first circular parts, and
   a fourth semi-circular part disposed outside an outermost first circular part of the first circular parts; and
   connection means configured to interconnect one of the first and second circular parts and the first to fourth semi-circular parts, wherein at least portions of the second circular parts are respectively interposed between the first circular parts, and at least portions of the second semi-circular parts are respectively interposed between the first semi-circular parts.

8. The semiconductor device of claim 7, wherein the first and second circular parts are thicker than the first wire.

9. The semiconductor device of claim 7 wherein the first to fourth semi-circular parts are thicker than the first wire.

10. The semiconductor device of claim 7, further comprising:
   interlayer insulation films configured to respectively cover the first wire, the first and second circular parts and the first to fourth semi-circular parts; and
   a passivation film configured to cover an uppermost interlayer insulation film among the interlayer insulation films,
   wherein the first layer corresponds to the uppermost interlayer insulation film.

11. The semiconductor device of claim 7, further comprising:
   a first terminal line disposed on the first layer and connected to the outermost first circular part; and
   a second terminal line disposed on the first layer and connected to the fourth semi-circular part.

12. The semiconductor device of claim 11, wherein the connection means comprise vias, straight bars and oblique bars.

13. The semiconductor device of claim 12, wherein:
   the oblique bars comprise at least one oblique bar configured to connect at least one of the first semi-circular parts to another of the first semi-circular parts, and
   the inductor further comprises a third terminal line electrically connected to one of the straight bars and disposed on the first layer.

14. The semiconductor device of claim 13, wherein the third terminal line is interposed between the first terminal line and the second terminal line, and the first to third terminal lines are parallel to each other.

* * * * *